United States Patent
Noda et al.

(10) Patent No.: US 8,772,925 B2
(45) Date of Patent: Jul. 8, 2014

(54) BONDING STRUCTURE AND BONDING METHOD OF HEAT DIFFUSION MEMBER, AND COOLING UNIT USING THE SAME

(75) Inventors: Koji Noda, Chiryu (JP); Satoshi Sakimichi, Anjo (JP); Masahiro Sakamoto, Kariya (JP); Kimio Kohara, Nagoya (JP)

(73) Assignees: DENSO CORPORATION, Kariya (JP); Nippon Soken, Inc., Nishio (JP)

( * ) Notice: Subject to any disclaimer, the term of this patent is extended or adjusted under 35 U.S.C. 154(b) by 134 days.

(21) Appl. No.: 13/325,423

(22) Filed: Dec. 14, 2011

(65) Prior Publication Data
US 2012/0152510 A1 Jun. 21, 2012

(30) Foreign Application Priority Data

Dec. 16, 2010 (JP) ................. 2010-280815
Jul. 11, 2011 (JP) ................. 2011-153181

(51) Int. Cl.
- H01L 23/10 (2006.01)
- H01L 23/34 (2006.01)
- H01L 23/36 (2006.01)
- H01L 23/367 (2006.01)

(52) U.S. Cl.
CPC ............. *H01L 23/34* (2013.01); *H01L 23/36* (2013.01); *H01L 23/367* (2013.01); *H01L 23/3672* (2013.01)
USPC ...................................................... 257/706

(58) Field of Classification Search
CPC ....... H01L 23/34; H01L 23/36; H01L 23/367; H01L 23/3672; G06F 1/20; F21V 29/22; F28F 3/00; F28F 27/00
USPC ......... 257/276, 625, 706, 707, 712–722, 796, 257/E33.075, E31.131, E23.08–E23.113; 438/122, 125

See application file for complete search history.

(56) References Cited

U.S. PATENT DOCUMENTS

| | | | |
|---|---|---|---|
| 2007/0058349 A1* | 3/2007 | Ishikawa ....................... | 361/704 |
| 2008/0315401 A1 | 12/2008 | Imamura et al. | |
| 2009/0095461 A1 | 4/2009 | Lemak et al. | |
| 2013/0119322 A1* | 5/2013 | Ide et al. ...................... | 252/514 |

OTHER PUBLICATIONS

U.S. Appl. No. 13/068,428, filed May 11, 2011, Sakimichi et al.

* cited by examiner

*Primary Examiner* — Jae Lee
*Assistant Examiner* — Junaiden Mirsalahuddin
(74) *Attorney, Agent, or Firm* — Harness, Dickey & Pierce, PLC (57) ABSTRACT

A bonding structure includes a first member, a second member and a bonding member. The first member has a plate shape and is made of a carbon-base material. The first member serves as a heat diffusion member that transfers heat at least in a thickness direction, which is perpendicular to a plane of the plate shape. The second member is bonded to the first member through the bonding member. The first member has a metal thin film at least on an opposed surface that is opposed to the second member. The bonding member is disposed between the opposed surface of the first member and the second member. The bonding member is provided by a sintered body of metal particle. For example, the bonding structure is employed in a cooling unit including a heat source.

6 Claims, 9 Drawing Sheets

HIGH HEAT
CONDUCTIVE
DIRECTIONS

HIGH HEAT
CONDUCTIVE
DIRECTIONS

BONDING STRUCTURE AND BONDING METHOD OF HEAT DIFFUSION MEMBER, AND COOLING UNIT USING THE SAME

CROSS REFERENCE TO RELATED APPLICATION

This application is based on Japanese Patent Applications No. 2010-280815 filed on Dec. 16, 2010 and No. 2011-153181 filed on Jul. 11, 2011, the disclosures of which are incorporated herein by reference.

FIELD OF THE INVENTION

The present invention relates to bonding structure and bonding method of a heat diffusion member, and a cooling unit using the same.

BACKGROUND OF THE INVENTION

In recent years, it has been proposed to form a heat diffusion member for cooling a heat source such as a semiconductor element of a carbon base material such as graphite, carbon fiber, a carbon-metal composite, or diamond, in place of a metallic material such as copper and aluminum.

For example, JP2009-4666A, which corresponds to US2008/0315401A1, describes to employ a heat diffusion member made of a carbon fiber-metal composite between a semiconductor element and a heat radiation plate. The heat diffusion member is disposed such that an orientation direction of carbon fiber coincides with a thickness direction of the heat diffusion member, so as to enhance heat conduction from the semiconductor element to the heat radiation plate. The thickness direction means a direction in which a thickness of the heat diffusion member is measured.

The carbon fiber has a coefficient of thermal conductivity of approximately 1000 W/mk in the orientation direction. Therefore, the heat diffusion member has a coefficient of thermal conductivity higher than that of copper (e.g., 350 to 400 W/mk) and that of aluminum (e.g., 200 to 240 W/mk) in the orientation direction.

In JP2009-4666A, however, an Ag—Cu—In base brazing material or an Ag—Cu—In—Ti base brazing material is used to bond the heat diffusion member to an adjacent member. Therefore, a bonding temperature (e.g., bonding temperature) is high, such as 500 to 800 degrees Celsius, and hence a thermal stress due to a difference of coefficient of linear expansion between the carbon-based heat diffusion member and the adjacent member is likely to increase. If the thermal stress, that is, a residual stress at the bonding interface is large, a breakage will easily occur at the bonding interface during an operation of the semiconductor element.

SUMMARY OF THE INVENTION

In a bonding structure according to an aspect, a first member and a second member are bonded to each other through a bonding member. The first member has a plate shape and is made of a carbon-base material. The first member serves as a heat diffusion member that transfers heat in a thickness direction, which is perpendicular to a plane of the plate shape. The first member has a metal thin film at least on an opposed surface that is opposed to the second member. The bonding member is disposed between the opposed surface of the first member and the second member. The bonding member is provided by a sintered body of metal particle.

In such a structure, since the first member transfers heat in the thickness direction, heat can be efficiently transferred in an arrangement direction of the first member and the second member. Since the bonding member is provided by the sintered body of metal particle, the first member and the second member are bonded through the bonding member at a temperature, which is lower than the conventional brazing temperature. Therefore, a thermal stress caused by a difference of coefficient of linear expansion of the first member and the second member is reduced. That is, a thermal stress at an interface between the first member and the second member is reduced.

A cooling unit according to an aspect includes a heat source, a first member serving as a heat diffusion member, a second member, a cooler and a bonding member. The first member has a plate shape and is made of a carbon-base material. The first member serves as the heat diffusion member that transfers heat in a thickness direction, which is perpendicular to a plane of the plate shape. The heat source is disposed at a first side of the first member. The second member is disposed at least at one of the first side and a second side of the first member. The cooler is disposed at the second side of the first member for cooling the heat source. The first member has a metal thin film at least on an opposed surface that is opposed to the second member. The bonding member is disposed between the opposed surface of the first member and the second member to bond the first member and the second member to each other. The bonding member is provided by a sintered body of metal particle.

In such a structure, since the first member transfers heat in the thickness direction, heat generated from the heat source can be efficiently transferred in an arrangement direction of the first member and the second member. Since the bonding member is provided by the sintered body of metal particle, the first member and the second member are bonded through the bonding member at a temperature, which is lower than the conventional brazing temperature. Therefore, a thermal stress caused by a difference of coefficient of linear expansion of the first member and the second member is reduced. That is, a thermal stress at an interface between the first member and the second member is reduced.

In a bonding method according to an aspect, a first member is formed with a carbon-base material into a plate shape, the first member being a heat diffusion member that transfers heat in a thickness direction perpendicular to a plane of the plate shape. A metal thin film is formed on a surface of the first member. A paste in which a metal particle is dispersed in a solvent is deposited on at least one of the metal thin film of the first member and a surface of a second member. The first member and the second member are placed on top of the other through the paste, and heated to sinter the metal particle, thereby to bond the first member and the second member to each other.

In such a method, since the paste containing the metal particle is used, the first member and the second member are bonded to each other at a temperature lower than the conventional brazing temperature. Therefore, a thermal stress caused by a difference of coefficient of linear expansion of the first member and the second member is reduced.

BRIEF DESCRIPTION OF THE DRAWINGS

Other objects, features and advantages of the present invention will become more apparent from the following detailed description made with reference to the accompanying drawings, in which like parts are designated by like reference numbers and in which.

DETAILED DESCRIPTION OF EXEMPLARY EMBODIMENTS

Exemplary embodiments will be described with reference to the drawings. In the drawings, like parts are designated with like reference numbers.

First Embodiment

Hereinafter, a cooling unit 10 having a heat source 12 and a heat diffusion member 11, a bonding structure of the heat diffusion member 11, and a bonding method of the heat diffusion member 11 according to the first embodiment will be described with reference to FIGS. 1 through 3. Hereinafter, the cooling unit 10 will be also referred to as a heat source module 10.

Figure 1:
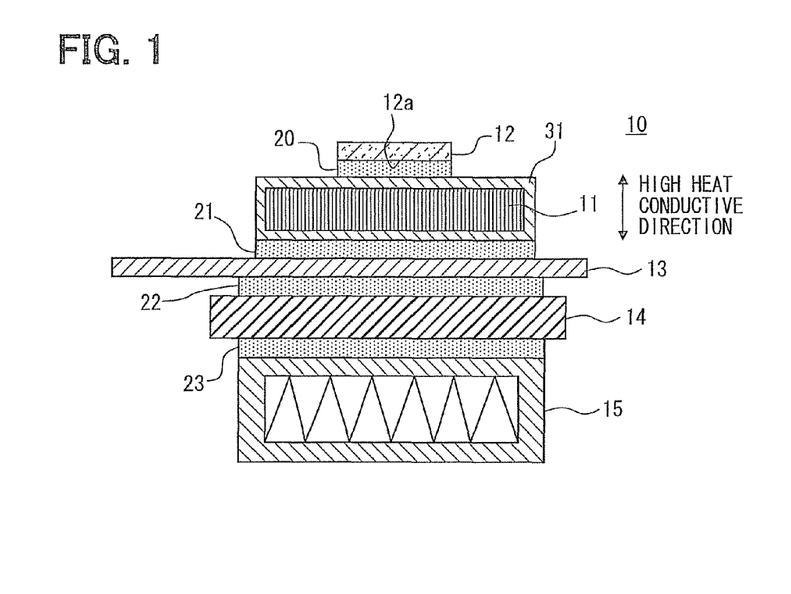
FIG. 1 is a cross-sectional view of a cooling unit of a heat source according to a first embodiment.

As shown in FIG. 1, the heat source module 10 includes the heat diffusion member 11, the heat source 12, a metal member 13, an electric insulating layer 14, and a cooler 15. The heat diffusion member 11 has a metal thin film 31 on its surface.

The heat source 12 is bonded to a surface of the heat diffusion member 11 through a bonding member 20. The metal member 13 is bonded to an opposite surface of the heat diffusion member 11 through a bonding member 21.

The electric insulating layer 14 is bonded to a surface of the metal member 13 through a bonding member 22 on an opposite side to the heat diffusion member 11. The cooler 15 is bonded to a surface of the electric insulating layer 14 through a bonding member 23 on an opposite side to the metal member 13.

For example, the heat diffusion member 11 corresponds to a first member, and the heat source 12 and/or the metal member 13 corresponds to a second member bonded to the first member through a bonding member. The bonding member 20, 21 corresponds to the bonding member having a thickness greater than a thickness of the metal thin film 31.

The heat diffusion member 11 has a plate shape and serves to efficiently transfer heat generated from the heat source 12 to the cooler 15. That is, the heat diffusion member 11 is configured to transfer heat in a thickness direction that is perpendicular to a plane of the plate shape. The thickness direction is a direction in which a thickness of the heat diffusion member 11 is measured, and corresponds to an up and down direction in FIG. 1, for example. The thickness direction of the heat diffusion member 11 also corresponds to a high heat conductive direction.

The heat diffusion member 11 is made of a carbon-base material. The heat diffusion member 11 has the metal thin film 31 on its surface. In the present embodiment, the heat diffusion member 11 also serves to electrically connect an electrode of the heat source 12 and the metal member 13. That is, the heat diffusion member 11 has thermal conductivity and electric conductivity.

The carbon-base material of the heat diffusion member 11 is, for example, single carbon or a carbon composite that contains carbon as a main component and a metal such as copper or aluminum, a resin, or ceramic as a sub component. As an example of the carbon, graphite or carbon fiber is used.

Figure 2:
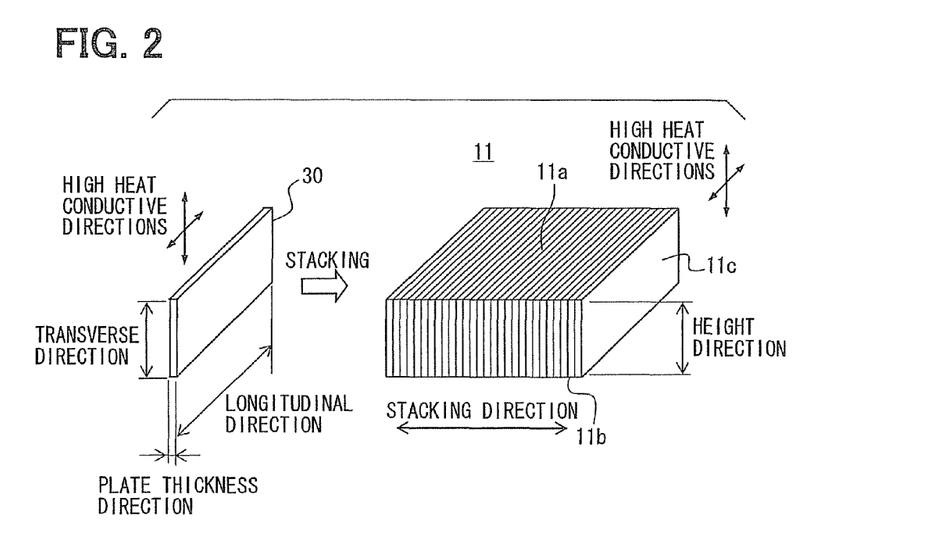
FIG. 2 is a perspective view of a heat diffusion member of the cooling unit shown in FIG. 1.

In the present embodiment, for example, the heat diffusion member 11 is provided by a stack of carbon-base plates 30 made of graphite, as shown in FIG. 2. The carbon-base plates 30 are stacked in a stacking direction, such as in a left and right direction in FIG. 2.

Graphite has a layer structure, and in each layer, each carbon atom is covalently bonded to three carbon atoms in a plane to form a condensed six-member ring. The layer structure has anisotropy where the layers are stacked with van der Waals coupling. Due to the layer structure, a property in a direction along the plane of the layer and a property in a direction perpendicular to the plane of the layer are different.

That is, the structure has the anisotropy of the thermal conductivity. Specifically, the structure has a higher coefficient of thermal conductivity (e.g., approximately 1000 W/mk) in two directions, which are perpendicular to each other and along the plane of the layer, and a lower coefficient of thermal conductivity (e.g., approximately 5 to 200 W/mk) in a direction perpendicular to the plane of the layer.

The carbon-base plate 30 has a rectangular shape where the thickness direction in which a thickness of the carbon-base plate 30 is measured corresponds to the direction perpendicular to the plane of the layers of the graphite, and a plane direction along the surface of the carbon-base plate 30 corresponds to the direction along the plane of the layers of the graphite.

For example, in FIG. 2, the thickness direction of the carbon-base plate 30 corresponds to the direction perpendicular to the plane of the layers of the graphite. Also, a longitudinal direction and a transverse direction of the carbon-base plate 30 correspond to the direction along the plane of the layers of the graphite. Thus, in FIG. 2, the carbon-base plate 30 has the high thermal conductivity in the longitudinal direction and in the transverse direction.

Further, in FIG. 1, the heat diffusion member 11 has the high thermal conductivity in the up and down direction and in a direction perpendicular to a paper surface of FIG. 1. As such, the heat diffusion member 11 has a higher coefficient of thermal conductivity in the direction perpendicular to the surfaces opposed to the heat source 12 and the metal member 13 than that in the direction parallel to the surfaces. That is, in the example of FIG. 1, the heat diffusion member 11 has the higher coefficient of thermal conductivity in the up and down direction than in the right and left direction that corresponds to the thickness direction or the stacking direction of the carbon-base plates 30.

In this way, since the carbon-base plates 30 having the higher thermal conductivity in two axis directions and the lower thermal conductivity in one axis direction are employed, the heat diffusion member 11 can diffuse heat not only in the direction corresponding to the thickness (height) direction of the heat diffusion member 11 but also in one direction along the plane perpendicular to the thickness direction of the heat diffusion member 11. Thus, the heat radiation property of the heat diffusion member 11 improves.

The thickness (height) of the heat diffusion member 11 is equal to the dimension (width) of the carbon-base plates 30 in the transverse direction. The carbon-base plates 30 are stacked so that the heat diffusion member 11 has a predetermined dimension in the stacking direction greater than the width of the carbon-base plate 30.

The heat diffusion member 11 is formed as a stacked body. For example, to form the heat diffusion member 11, the carbon-base plates 30 are layered over each other, and then burned. As another example, the heat diffusion member 11 is formed by successively spraying a gas-phase material (graphite material) on a plane. The heat diffusion member 11 may be similar to a heat diffusion member described in Japanese Patent Application No. 2010-132076, and thus a detailed description of the heat diffusion member 11 is omitted.

The heat diffusion member 11 has the metal thin film 31 on the surface thereof so as to improve a bonding property with the bonding members 20, 21. The metal thin film 31 is, for example, formed by plating or physical deposition such as evaporation coating or spattering. The metal thin film 31 is formed at least on a surface of the heat diffusion member 11 that is opposed to the second member. For example, the metal thin film 31 is formed at least on a first surface (e.g., upper surface) 11a of the heat diffusion member 11 to be opposed to the heat source 12 and on a second surface (e.g., lower surface) 11b of the heat diffusion member 11 to be opposed to the metal member 13.

Figure 3:
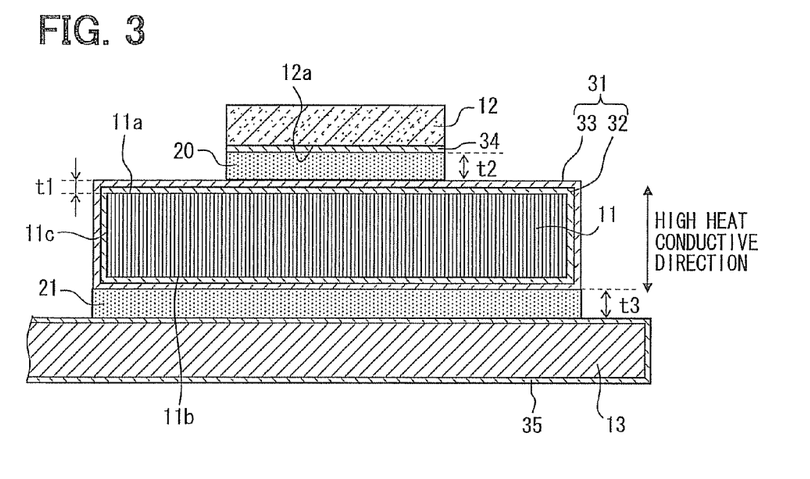
FIG. 3 is a cross-sectional view of a bonding part of the heat diffusion member of the cooling unit shown in FIG. 1.

As shown in FIG. 3, the metal thin film 31 has a two-layer structure including a base layer 32 and a surface layer 33 disposed on the base layer 32. The base layer 32 forms chemical bonding with the heat diffusion member 11. The surface layer 33 forms metal bonding with the bonding member 20, 21.

The base layer 32 is made of a metal material that forms covalent bonding with carbon (C) of the heat diffusion member 11 or ion bonding with a functional group (hydroxyl group) on the surface of the carbon. For example, the base layer 32 is made of a metal material including at least one of titanium (Ti), aluminum (Al), chromium (Cr), molybdenum (Mo) and tungsten (W). For example, the base layer 32 is made of a metal material containing one (e.g., Ti) of the above metals or an alloy (e.g., Ti alloy) containing at least one of the above metals. In the present embodiment, the base layer 32 is made of Ti, for example.

The surface layer 33 is made of a material that forms metal bonding with the metal of the bonding members 20, 21. For example, the surface layer 33 is made of a material that contains at least one of gold (Au), silver (Ag), platinum (Pt), palladium (Pd), nickel (Ni), tin (Sn), iron (Fe), copper (Cu) and lead (Pb). In the present embodiment, for example, the surface layer 33 is made of Au, for example. The metal of the surface layer 33 is not limited to the above described examples. For example, the metal of the surface layer 33 may be a noble metal such as rhodium (Rh).

In the present embodiment, the metal thin film 31 is formed not only on the first and second surfaces 11a, 11b but also on side surfaces 11c of the heat diffusion member 11. In other words, the metal thin film 31 is formed on an entire surface of the heat diffusion member 11.

Figure 4:
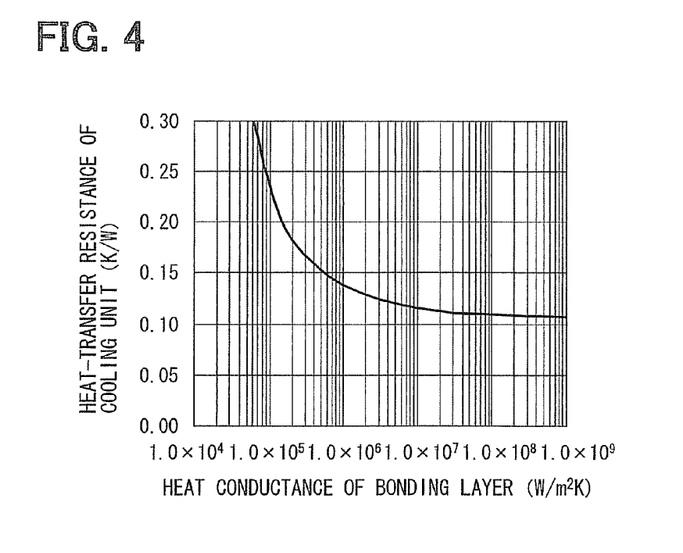
FIG. 4 is a graph showing a relationship between a heat conductance of the bonding part and a heat-transfer resistance of the cooling unit according to the first embodiment.

According to a relationship between a heat conductance of a bonding part and a heat-transfer resistance of the cooling unit shown in FIG. 4, the heat-transfer resistance is substantially fixed to approximately 0.10 K/W in a region where the heat conductance is over $1 \times 10^7$ W/m$^2$K. In a region where the heat conductance is less than $1 \times 10^7$ W/m$^2$K, the heat-transfer resistance largely changes with a small change in the heat conductance. The heat-transfer resistance increases with a decrease in the heat conductance.

Therefore, to efficiently transfer heat from the heat source 12 to the cooler 15, the metal thin film 31 has the heat conductance equal to or greater than $1 \times 10^7$ W/m$^2$K, for example. In FIG. 4, the heat-transfer resistance (K/W) of the cooling unit is defined as: the heat-transfer resistance (K/W)={(temperature (K) of the heat source 12 in a steady state−cooling water temperature (K))/heat value (W) of the heat source 12}.

Figure 5:
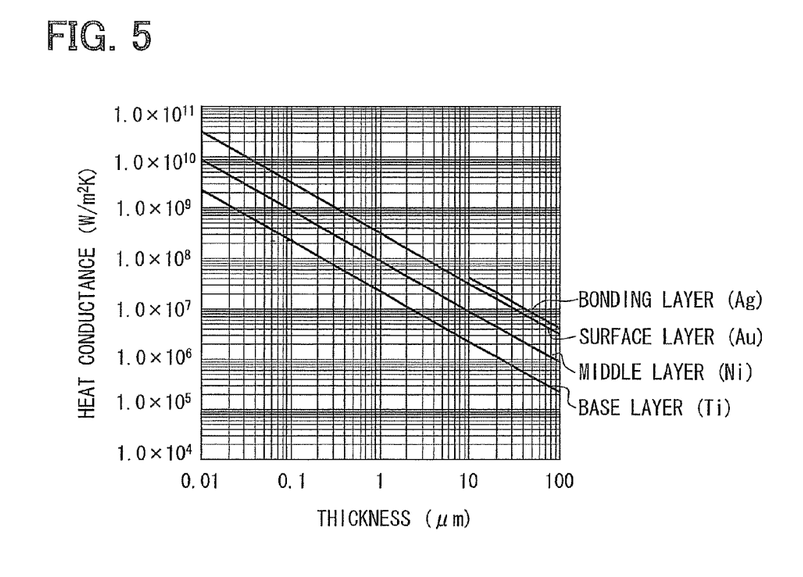
FIG. 5 is a graph showing a relationship between a thickness and the heat conductance according to the first embodiment.

According to FIG. 5, for example, in a case where the base layer 32 is made of Ti, the heat conductance of the base layer 32 is equal to or higher than $1 \times 10^7$ W/m$^2$K when the thickness is equal to or less than 2 micrometers. In a case where the surface layer 33 is made of Au, the heat conductance of the surface layer 33 is equal to or higher than $1 \times 10^7$ W/m$^2$K when the thickness is equal to or less than 30 micrometers.

In this way, when the Ti base layer 32 has the thickness equal to or less than 2 micrometers and the Au surface layer 33 has the thickness equal or less than 30 micrometers, the heat-transfer resistance of the metal thin film 31 is reduced and the heat conductance of the metal thin film 31 improves.

In the case where the metal thin film 31 is formed by plating or physical deposition such as evaporation coating or spattering, the metal thin film 31 can be formed so that the base layer 32 and the surface layer 33 satisfy the above described thicknesses. However, if the thickness is excessively reduced, pinholes will be easily formed when the base layer 32 and the surface layer 33 are formed. Therefore, each of the base layer 32 and the surface layer 33 has the thickness equal to or greater than 0.05 micrometers. In the present embodiment, for example, a total thickness t1 of the metal thin film 31 is approximately in a range between 0.2 micrometers and 5 micrometers.

The heat source 12 generates heat during an operation. For example, the heat source 12 is a semiconductor element in which devices are formed on a semiconductor substrate such as a silicon substrate. The semiconductor element is, for example, a power-type vertical element that has electrodes on both sides of a semiconductor substrate and an electric current passes in a vertical direction, such as in a direction in which the thickness of the semiconductor substrate is measured. The vertical element is, for example, a MOSFET, an IGBT, a FWD (free wheel diode) or the like. In the present embodiment, the heat source 12 is an IGBT formed in a silicon substrate, for example.

In the example of FIG. 1 and FIG. 3, only one heat source (semiconductor element) 12 is illustrated. However, the number of the heat source(s) 12 is not particularly limited.

The heat source 12 has a metal thin film on its surface to improve a bonding property with the bonding member 20. Similar to the metal thin film 31 of the heat diffusion member 11, the metal thin film of the heat source 12 is formed by plating or physical deposition such as evaporation coating or spattering. The metal thin film is formed at least on an opposed surface (e.g., lower surface) 12a of the heat source 12 that is opposed to the heat diffusion member 11.

The heat source 12 has at least a surface layer 34 as the metal thin film. Alternatively, the heat source 12 may further has another metal thin film that has a favorable bonding property with the surface layer 34 and the heat source 12, between the heat source 12 and the surface layer 34.

The metal thin film 34 is made of a metal that forms metal bonding with the metal of the bonding member 20. For example, the metal thin film 34 is made of at least one of Au, Ag, Pt, Pd, Ni, Sn, Fe, Cu, and Pb.

In the present embodiment, the surface layer 34 is formed over an entirety of the opposed surface 12a of the heat source 12 as the metal thin film, for example. The total thickness of the metal thin film (surface layer 34) is smaller than a thickness t2 of the bonding member 20. In the present embodiment, the thickness of the surface layer 34 as the metal thin film is approximately in a range between 0.1 micrometer and 1 micrometer.

The bonding member 20 is formed by sintering a metal particle. A sintering temperature of the metal particle, that is, a bonding temperature is lowered with a decrease in an average particle diameter of the metal particle. For example, when the average particle diameter is approximately several micrometers, the sintering temperature is equal to or less than 300 degrees Celsius. When the average particle diameter has a nano-size, that is, is in a range between 1 nanometer and 1000 nanometers, the sintering temperature can be further lowered.

The metal particle can be provided by a single metal, multiple metals, or a composite metal. As examples of the multiple metals for the metal particle, a combination of Ag particle and Cu particle, a combination of Ag particle and Sn particle, or a combination of Sn particle and Ni particle are employed. As examples of the composite metal for the metal particle, AgSn particle, PbSn particle and the like are employed.

In the present embodiment, for example, the metal particle is provided by nanosized particle of a single metal. As examples of the single metal, Ag, Au, Cu, or Ni, which has high thermal conductivity, can be employed. The coefficient of thermal conductivity of Ag is 427 W/mk. The coefficient of thermal conductivity of Au is 315 W/mk. The coefficient of thermal conductivity of Cu is 398 W/mk. The coefficient of thermal conductivity of Ni is 90 W/mk.

In the present embodiment, for example, the nanosized Ag particle, which has higher thermal conductivity, is used as the metal particle. It should be noted that the nanosized particle be a nanosized metal particle coated with an organic protection film.

The thickness t2 of the bonding member 20 is sufficiently larger than the thickness t1 of the metal thin film 31, as shown in FIG. 3. Similar to the metal thin film 31 as described above, the bonding member 20 has the heat conductance equal to or higher than $1 \times 10^7$ W/m$^2$K so as to efficiently transfer the heat from the heat source 12 to the cooler 15, for example.

According to FIG. 5, in a case where the bonding member 30 is made of Ag, the heat conductance of the bonding member 30 is equal to or greater than $1 \times 10^7$ W/m$^2$K when the thickness is equal to or less than 40 micrometers. As such, when the bonding member 20 has the thickness equal to or less than 40 micrometers, the heat-transfer resistance of the bonding member 20 is reduced, and the heat is easily transferred.

The bonding member 20 is made by depositing a metal paste in which the metal particle is dispersed in a solvent, such as by screen printing, and sintering the metal particle.

In such a case, it is difficult to reduce the thickness of the bonding member 20 as the thickness of the metal thin film 31. The thickness of the bonding member 20 is approximately 10 micrometers at least. Therefore, the bonding member 20 has the thickness t2 in a range between 10 micrometers and 40 micrometers, for example. In the present embodiment, the bonding member 20 made of Ag has the thickness t2 in a range between 20 micrometers and 40 micrometers, for example.

The metal member 13 is made of a metal having high thermal conductivity, such as Cu or Al. The metal member 13 is disposed between the heat diffusion member 11 and the electric insulating layer 14. The metal member 13 is electrically connected to one of electrodes of the semiconductor element as the heat source 12 through the bonding members 20, 21 and the heat diffusion member 11. That is, the metal member 13 serves as an external terminal, such as a lead, for allowing connection with an external device.

The metal member 13 has a metal thin film on the surface thereof so as to improve a bonding property with the bonding member 21. Similar to the metal thin film 31 of the heat diffusion member 11, the metal thin film of the metal member 13 is formed by plating or physical deposition such as evaporation coating or spattering. The metal thin film is formed at least on an opposed surface opposed to the heat diffusion member 11.

The metal member 13 at least has a surface layer 35 as the metal thin film. Alternatively, the metal member 13 may further has another metal thin film that has a favorable bonding property with the surface layer 35 and the metal member 13, between the metal member 13 and the surface layer 35. In such a case, the another metal thin film and the surface layer 35 are formed as the metal thin film.

The surface layer 35 is made of a metal material that forms metal bonding with the metal of the bonding member 21. For example, the metal material of the surface layer 35 contains at least one of Au, Ag, Pt, Pd, Ni, Sn, Fe, Cu, and Pb. In the present embodiment, for example, the surface layer 35 is formed over the entire surface of the metal member 13 as the metal thin film.

The total thickness of the metal thin film (surface layer 35) is smaller than the thickness t3 of the bonding member 21. In the present embodiment, for example, the thickness of the surface layer 35 as the metal thin film is approximately in a range between 0.1 micrometer and 1 micrometer.

Similar to the bonding member 20, the bonding member 21 is made by sintering a metal particle. In the present embodiment, the bonding member 21 has the same structure as that of the bonding member 20. For example, the bonding member 21 is made by sintering the nanosized Ag particle. For example, the thickness t3 of the bonding member 21 is in a range between 20 micrometers and 40 micrometers, similar to the thickness t2 of the bonding member 20.

The electric insulating layer 14 is disposed between the heat diffusion member 11 having the electric conductivity and the cooler 15. The electric insulating layer 14 restricts electric leak from the heat source 12 to the cooler 15. For example, the electric insulating layer 14 is provided by a ceramic plate, a film made of a mixture of a ceramic material and a resin material, or the like. In the present embodiment, the electric insulating layer 14 is made of ceramic.

The cooler 15 is a heat exchanger for cooling the heat source 12. The cooler 15 has a generally plate-shaped body in which multiple passages are formed. A cooling medium such as a cooling air or a coolant flows in the multiple passages. Thus, the heat of the heat source 12 is transferred to the cooling medium, and hence the heat source 12 is cooled.

The bonding member 22 is made of a material that has favorable thermal conductivity, and can bond the metal member 13 and the electric insulating layer 14. The bonding member 23 is made of a material that has favorable thermal conductivity, and can bond the electric insulating layer 14 and the cooler 15. Since the bonding members 22, 23 are disposed between the metal member 13 and the cooler 15, electric conductivity is not necessarily required to the bonding members 22, 23.

Also, it is not always necessary that the electric insulating layer 14 is bonded with the metal member 13 and the cooler 15. For example, in place of the bonding members 22, 23, a grease material can be used between the metal member 13 and the electric insulating layer 14 and between the electric insulating layer 14 and the cooler 15. The grease material can reduce an interface heat-transfer resistance by being spread in a thin and wetted manner between the metal member 13 and the electric insulating layer 14 and between the electric insulating layer 14 and the cooler 15.

In a case where the electric insulating layer 14 is made of a material having elasticity or an adhesion property, the electric insulating layer 14 can be tightly in contact with the metal member 13 and the cooler 15. In such a case, the bonding members 22, 23 are not necessary.

In the heat source module 10 having the above described structure, the heat of the heat source 12 is transferred to the heat diffusion member 11 through the bonding member 20. In the heat diffusion member 11, the heat is transferred in the thickness (height) direction while spreading in the longitudinal direction of the carbon-base plates 30.

The heat is transferred to the metal member 13 through the bonding member 21. Further, the heat is transferred to the cooler 15 through the bonding member 22, the electric insulating layer 14 and the bonding member 23. In the cooler 15, the heat from the heat source 12 is transferred to the cooling medium passing through the internal passages. In this way, the heat source 12 is cooled.

Next, advantageous effects of the heat source module 10 will be described.

The heat diffusion member 11 as the first member is made of the carbon-base material. The heat diffusion member 11 has the high thermal conductivity in the thickness (height) direction because of the orientation of the carbon-base plated 30. Therefore, the heat of the heat source 12 can be efficiently transferred to the heat diffusion member 11 in an arrangement direction of the heat source 12 and the heat diffusion member 11 through the bonding member 20, that is, in the thickness direction of the heat diffusion member 11.

Further, the heat can be efficiently transferred from the heat diffusion member 11 to the metal member 13 in an arrangement direction of the heat diffusion member 11 and the metal member 13 through the bonding member 21, that is, in the thickness direction of the heat diffusion member 11.

Each of the bonding members 20, 21, which contact the heat diffusion member 11, is provided by a sintered body of the metal particle. The sintered body is formed by the following method.

First, a metal paste is prepared. In the metal paste, a metal particle coated with an organic protection film is dispersed in a solvent. Then, the metal paste is deposited on at least one of the heat source 12 and the heat diffusion member 11, for example, by screen printing. Thereafter, the metal paste is heated, so the organic protection film and the solvent are evaporated by thermal decomposition. Therefore, the surface of the metal particle is exposed and the metal particle form metal bonding therein.

The metal particle can be sintered at a temperature (e.g., equal to or less than 300 degrees Celsius) lower than the conventional brazing temperature. Therefore, the thermal stress caused by the difference of coefficient of linear expansion between the heat source 12 and the heat diffusion member 11 can be reduced. That is, a thermal stress at the bonding interface can be reduced. Likewise, the thermal stress caused by the difference of coefficient of linear expansion between the heat diffusion member 11 and the metal member 13 can be reduced. That is, a thermal stress at the bonding interface can be reduced.

For example, the Ag paste is deposited on the metal thin film 31 of the first surface 11a of the heat diffusion member 11, and the heat source 12 is disposed on the Ag paste such that the surface layer 34 of the lower surface 12a of the heat source 12 contacts the Ag paste. The heat diffusion member 11 and the heat source 12 are heated in this arrangement condition to sinter the Ag particle. In this way, the bonding member 20 is formed.

Likewise, the Ag paste is deposited on the surface layer 35 of the opposed surface of the metal member 13, and the heat diffusion member 11 is disposed on the Ag paste such that the metal thin film 31 of the second surface 11b contacts the Ag paste. The metal member 13 and the heat diffusion member 11 are heated in this arrangement condition to sinter the Ag particle. In this way, the bonding member 21 is formed.

Accordingly, in the heat source module 10 having the heat diffusion member 11 made of the carbon-base material, the thermal stress at the bonding interface, such as between the heat diffusion member 11 and the adjacent heat source 12, and between the heat diffusion member 11 and the adjacent metal member 13, can be reduced.

The metal particle having the nanosized average particle diameter is employed to form the bonding members 20, 21. The surface activity of the metal particle increases with a decrease in the average particle diameter. Thus, the metal particle can be sintered at a lower temperature, such as at equal to or lower than 100 degrees Celsius. Therefore, the thermal stress is further effectively reduced.

In the present embodiment, the thickness of the bonding member 20 is greater than the thickness of the metal thin film 31. Therefore, with regard to the heat-transfer resistance in the heat transferring path from the heat source 12 to the heat diffusion member 11, the bonding member 20 more affects than the metal thin film 31. Likewise, the thickness of the bonding member 21 is greater than the thickness of the metal think film 31. Therefore, with regard to the heat-transfer resistance in a heat transferring path from the heat diffusion member 11 to the metal member 13, the bonding member 21 more affects than the metal thin film 31.

In the heat source module of the present embodiment, therefore, each of the bonding member 20, 21 is provided by the sintered body of the single metal. The bonding member provided by the sintered body of the single metal has the coefficient of thermal conductivity higher than that provided by a sintered body of an alloy of multicomposite. As such, the heat-transfer resistance in the heat transferring path is reduced, that is, the heat transferring loss in the bonding members 20, 21 is reduced.

Accordingly, the heat of the heat source 12 can be efficiently transferred to the cooler 15 through the bonding member 20, 21 and the heat diffusion member 11. In the case where both of the bonding members 20, 21 are provided by the sintered body of Ag, the heat-transfer resistance in the heat transferring path can be further reduced.

In addition, the total thickness t1 of the metal thin film 31 is approximately in a range between 0.2 micrometers and 5 micrometers, and is sufficiently smaller than the thicknesses t2, t3 (e.g., approximately 20 micrometers to 40 micrometers) of the bonding members 20, 21. Therefore, the heat-transfer resistance at the metal thin film 31 is almost disregarded in the heat transferring path between the heat diffusion member 12 and the heat source 12 and in the heat transferring path between the heat diffusion member 11 and the metal member 13. Accordingly, the heat-transfer resistance reduction effect achieved by the bonding members 20, 21 is notable in the heat transferring paths.

In the above described embodiment, the heat diffusion member 11 exemplarily has the metal thin film 31 including the base layer 32 and the surface layer 33. However, the structure of the metal thin film 31 is not limited to the two layer structure including the base layer 32 and the surface layer 33.

Figure 6:
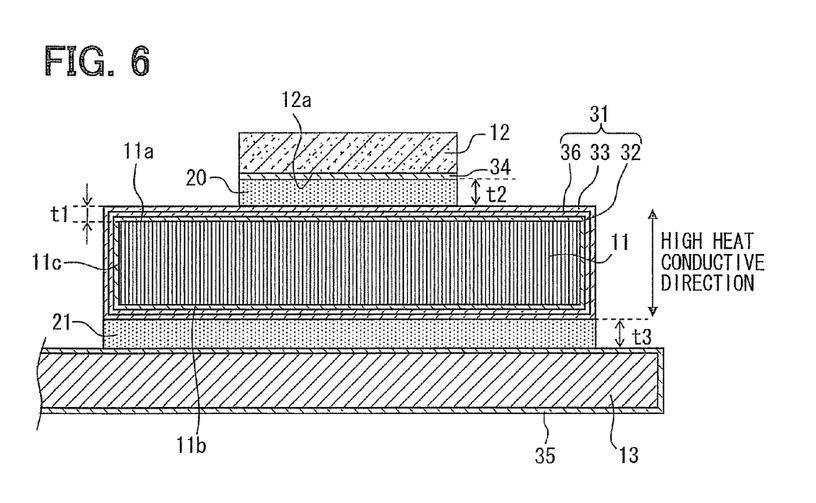
FIG. 6 is a cross-sectional view of the bonding part as a first modification of the first embodiment.

For example, as shown in FIG. 6, the metal thin film 31 has a three layer structure including the base layer 32, a middle layer 36 and the surface layer 33. The middle layer 36 is made of at least one of Au, Ag, Pt, Pd, Ni, Sn, Fe, Cu and Pb, the one being different from the metal of the surface layer 33, and forming an alloy layer at an interface with each of the base layer 32 and the surface layer 33.

For example, in a case where the middle layer 36 is made of a single metal (e.g., Ni), the middle layer 36 is alloyed at the interface with the base layer 32 (e.g., Ti) and at the interface with the surface layer 33 (e.g., Au). Therefore, the bonding strength of the metal thin film 31 improves. Further, the bonding strength between the heat diffusion member 11 and the bonding members 20, 21 improves.

The middle layer 36 has the heat conductance equal to or higher than $1 \times 10^7$ W/m²K, similar to the base layer 32 and the surface layer 33. For example, in the case where the middle layer 36 is made of Ni, the heat conductance of the middle layer 36 is equal to or higher than $1 \times 10^7$ W/m²K when the thickness is equal to or less than 10 micrometers, as shown in FIG. 5. When the middle layer 36 has the thickness equal to or less than 10 micrometers, the heat-transfer resistance of the metal thin film 31 is reduced, and thus the thermal conductivity improves.

The middle layer 36 can be formed by plating or physical deposition such as by evaporation coating or spattering. Therefore, the metal thin film 31 satisfying the above described thickness can be formed. However, if the thickness is excessively reduced, pinholes will be formed when the middle layer 36 is formed. Therefore, the thickness of the middle layer 36 is equal to or greater than 0.05 micrometers, for example.

Figure 7:
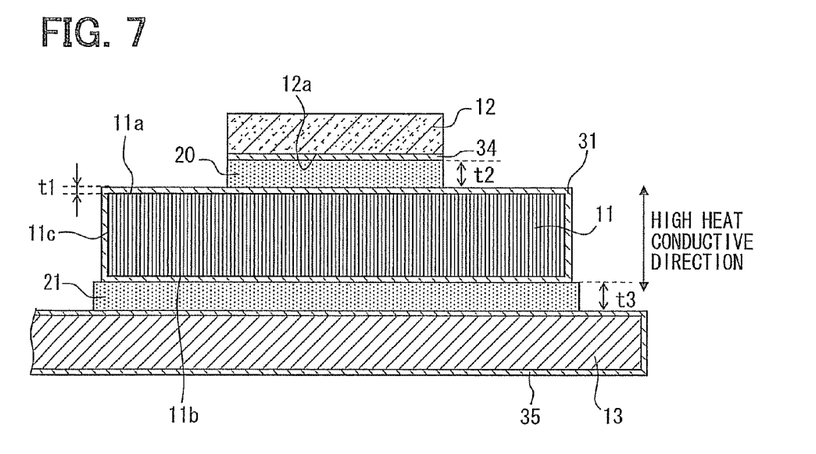
FIG. 7 is a cross-sectional view of the bonding part as a second modification of the first embodiment.

As another example, the metal thin film 31 has a single layer structure, as shown in FIG. 7. In this case, the metal thin film 31 is made of a material that forms chemical bonding with the material of the heat diffusion member 11 or a material that forms metal bonding with the bonding members 20, 21. For example, the metal thin film 31 is made of a material used for the base layer 32 or the surface layer 33, such as Ti, Al, Cr, Mo, W, Au, Ag, Pt, Pd, Ni, Sn, Fe, Cu, and Pb.

In the first embodiment, the heat diffusion member 11 is provided by the carbon-base plates 30 and has the higher thermal conductivity in two directions and the lower thermal conductivity in one direction perpendicular to the two directions. That is, the heat diffusion member 11 has anisotropy of the thermal conduction. Alternatively, the heat diffusion member 11 may have isotropy of the thermal conduction.

The heat diffusion member 11 that has the isotropy of the thermal conduction and the electric conductivity is made of a carbon-base material that is provided by processing graphite or carbon fiber to have non-orientation, or a composite material that is provided by adding a metal particle to diamond having an electric insulating property for imposing the electric conductivity. When the heat diffusion member 11 is made of such a carbon-base material or a composite material, the heat diffusion member 11 shows the thermal conductivity in three directions. Therefore, the heat source 12 can be effectively cooled even if only one heat diffusion member 11 is employed.

Second Embodiment

A second embodiment will be described with reference to FIGS. 8 and 9. Hereinafter, a structure different from the heat source module 10 of the first embodiment will be mainly described.

In the first embodiment, the heat source module 10 has only one heat diffusion member 11 between the heat source 12 and the metal member 13. In the present embodiment, on the other hand, the heat source module 10 has two heat diffusion members, such as a first heat diffusion member 16 and a second heat diffusion member 17, between the heat source 12 and the metal member 13. In other words, the heat diffusion member 11 is provided by the first heat diffusion member 16 and the second heat diffusion member 17.

Figure 8:
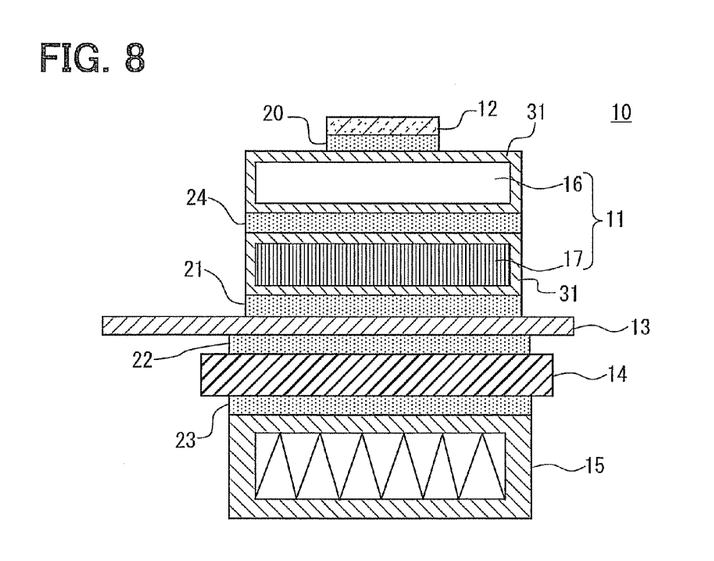
FIG. 8 is a cross-sectional view of a cooling unit of a heat source according to a second embodiment.

The heat diffusion members 16, 17 are layered in the thickness direction thereof, that is, in the up and down direction of FIG. 8. The first heat diffusion member 16 and the second heat diffusion member 17 have substantially the same structure as the heat diffusion member 11 of the first embodiment. However, the first heat diffusion member 16 and the second heat diffusion member 17 are arranged such that the stacking direction of the carbon-base plates 30 is different therebetween, as shown in FIG. 9.

The first heat diffusion member 16 is disposed adjacent to the heat source 12, and the second heat diffusion member 17 is disposed adjacent to the metal member 13. The bonding member 20 disposed between the heat source 12 and the first heat diffusion member 16 and the bonding member 21 disposed between the second heat diffusion member 17 and the metal member 13 have the same structure as the bonding members 20, 21 of the first embodiment.

Any one of the first and second heat diffusion members 16, 17 corresponds to the first member, and the other of the first and second heat diffusion members 16, 17 corresponds to the second member. For example, the first heat diffusion member 16 corresponds to the first member, and the second heat diffusion member 17 corresponds to the second member. Alternatively, the first heat diffusion member 16 corresponds to the second member, and the second heat diffusion member 17 corresponds to the first member.

Figure 9:
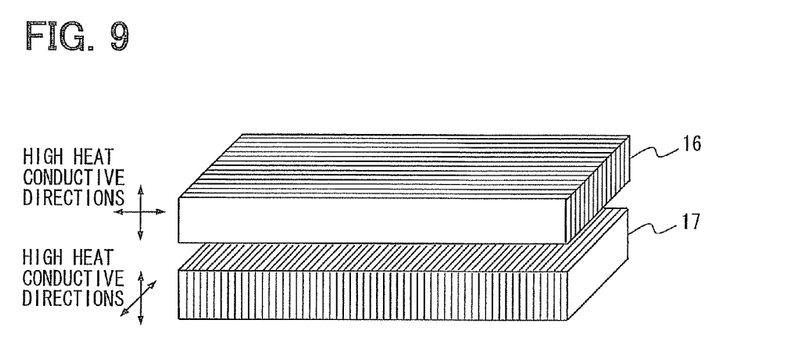
FIG. 9 is a perspective view of a heat diffusion member of the cooling unit shown in FIG. 8.

The first heat diffusion member 16 is oriented such that the stacking direction of the carbon-base plates 30 is generally perpendicular to the paper surface of FIG. 9. Therefore, the first heat diffusion member 16 has the higher thermal conductivity in the up and down direction of FIG. 8, that is, in the thickness direction of the first heat diffusion member 16, and in the right and left direction of FIG. 8.

On the other hand, the second heat diffusion member 17 is oriented such that the stacking direction of the carbon-base plates 30 corresponds to the right and left direction of FIG. 9. Therefore, the second heat diffusion member 11 has the higher thermal conductivity in the up and down direction of FIG. 8, that is, in the thickness direction of the second heat diffusion member 17, and in the direction generally perpendicular to the paper surface of FIG. 8. As described above, the stacking direction of the carbon-base plates 30 of the first heat diffusion member 16 and the stacking direction of the carbon-base plates 30 of the second heat diffusion member 17 are substantially perpendicular to each other, that is, intersect each other at a substantially right angle.

The first heat diffusion member 16 and the second heat diffusion member 17 are stacked on top of the other with respect to the thickness direction, and are bonded to each other with a bonding member 24 disposed therebetween.

Similar to the bonding members 20, 21, the bonding member 24 is provided by a sintered body of metal particle. The bonding member 24 has a thickness greater than that of the metal thin film 31 of the first and second heat diffusion members 16, 17. For example, the thickness of the bonding member 24 is in a range between 20 micrometers and 40 micrometers, similar to the thickness t2, t3 of the bonding members 20, 21. The bonding member 24 is formed by depositing a metal paste in which a metal particle is dispersed on at least one of opposed surfaces of the first and second heat diffusion members 16, 17 and by heating.

In a plane perpendicular to the thickness direction of the first and second heat diffusion members 16, 17, the direction of the high thermal conduction of the first heat diffusion member 16 and the direction of the high thermal conduction of the second heat diffusion member 17 are perpendicular to each other. Therefore, when the stacked two heat diffusion members 16, 17 are regarded as one heat diffusion member 11, the heat diffusion member 11 has the high thermal conductivity in two directions perpendicular to the thickness direction, in addition to the thickness direction. Namely, the heat diffusion member 11 has the high thermal conductivity in three directions. Therefore, the heat source 12 can be further efficiently cooled.

For example, in the structure shown in FIG. 8, the heat of the heat source 12 is transferred to the cooler 15 through the first and second heat diffusion member 16, 17 in the thickness direction. In addition, the heat of the heat source 12 can be radiated from side surfaces of the heat diffusion member 11 (first and second heat diffusion members 16, 17) in directions perpendicular to the thickness direction.

The bonding member 24 is provided by the sintered body of the metal particle, similar to the bonding members 20, 21. Therefore, the bonding member 24 can be formed at the temperature (e.g., equal to or lower than 300 degrees Celsius) lower than the conventional brazing temperature.

As such, the thermal stress due to the difference of coefficient of linear expansion of the two heat diffusion members 16, 17 having anisotropic of the coefficient of linear expansion can be reduced. That is, the thermal stress at a bonding interface between the heat diffusion members 16, 17 can be reduced.

For example, Ag paste is deposited on the metal thin film 31 of at least one of the opposed surfaces of the first and second heat diffusion members 16, 17, and the first and second heat diffusion members 16, 17 are laid on top of the other through the Ag paste. Then, in this arrangement condition, the heat diffusion members 16, 17 are heated to sinter Ag particle. In this way, the bonding member 24 is formed.

In the heat source module 10 of the present embodiment, the thermal stress at the bonding interface between the first heat diffusion member 16 and the second heat diffusion member 17 can be reduced. Further, the thermal stress at the bonding interfaces between the heat diffusion member 16 and the heat source 12 and between the heat diffusion member 17 and the metal member 13 can be educed, similar to the first embodiment.

Also in the present embodiment, the metal particle of the bonding member 24 has the nanosized average particle diameter. Therefore, the thermal stress acting between the first and second heat diffusion members 16, 17 can be effectively reduced.

The bonding member 24 disposed between the first and second heat diffusion members 16, 17 has the thickness greater than the thickness of the metal thin film 31. Therefore, with regard to the heat-transfer resistance in the heat transferring path between the first heat diffusion, member 16 and the second heat diffusion member 17, the bonding member 24 more affects than the metal thin film 31.

In a case where the bonding member 24 is provided by the sintered body of the single metal, the thermal conductivity of the bonding member 24 improves, as compared with a bonding member provided by a multicomposite alloy. Therefore, the heat transferring loss in the bonding member 24 is reduced. That is, the heat-transfer resistance in the heat transferring path is reduced, and hence the heat of the heat source 12 can be efficiently transferred to the cooler 15. In a case where the bonding member 24 is made of Ag, the heat-transfer resistance of the heat transferring path can be further reduced.

The total thickness t1 of the metal thin film 31 is approximately in a range between 0.2 micrometers and 5 micrometers, and is sufficiently smaller than the thickness (e.g., approximately 20 micrometers to 40 micrometers) of the bonding members 20, 21, 24. Therefore, the heat-transfer resistance at the metal thin film 31 is almost disregarded in the heat transferring path between the first heat diffusion member 16 and the heat source 12, in the heat transferring path between the first heat diffusion member 16 and the second heat diffusion member 17, and in the heat transferring path between the second heat diffusion member 17 and the metal member 13. Accordingly, the thermal reduction effect achieved by the bonding members 20, 21, 24 is notable in the heat transferring paths.

In the present embodiment, the heat diffusion member 11 is exemplarily provided by two heat diffusion members 16, 17. Alternatively, the heat diffusion member 11 may be provided by three or more heat diffusion members stacked to each other. Also in such a case, the heat diffusion members are stacked such that the stacking direction of the carbon-base plates 30 is different between the adjacent heat diffusion members.

Third Embodiment

A third embodiment will be described with reference to FIG. 10. Hereinafter, a structure different from the above described embodiments will be mainly described.

In the above described embodiments, the heat diffusion member 11 is disposed between the heat source 12 and the metal member 13. In the present embodiment, the heat diffusion member 11 is disposed between the metal member 13 and the electric insulating layer 14, as shown in FIG. 10.

Figure 10:
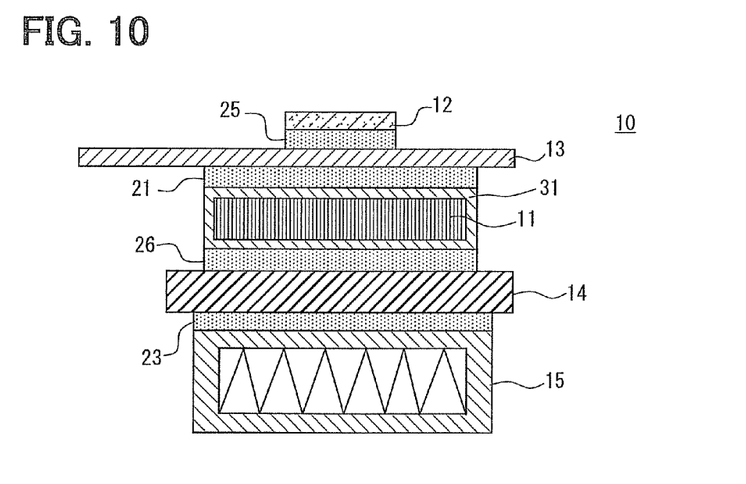
FIG. 10 is a cross-sectional view of a cooling unit of a heat source according to a third embodiment.

As shown in FIG. 10, the heat source module 10 has the similar components to the heat source module 10 of the first embodiment, but the metal member 13 and the electric insulating layer 14 are arranged adjacent to the heat diffusion member 11. Thus, the metal member 13 and the electric insulating layer 14 correspond to the second member.

The bonding member 21 disposed between the metal member 13 and the heat diffusion member 11 is same as the bonding member 21 of the first embodiment. A bonding member 25 disposed between the heat source 12 and the metal member 13 is provided by a material that has high thermal conductivity and high electric conductivity and can bond between the heat source 12 and the metal member 13, such as solder. Further, the bonding member 25 may be provided by a sintered body of metal particle. In such a case, the heat-transfer resistance at the bonding interface can be reduced, and the thermal conductivity is improved.

A bonding member 26 disposed between the heat diffusion member 11 and the electric insulating layer 14 is provided by a sintered body of metal particle, similar to the bonding members 20, 21 of the first embodiment. Therefore, the bonding member 26 is formed by sintering (bonding) a metal particle at a low temperature (e.g., equal to or lower than 300 degrees Celsius). As such, a thermal stress caused by a difference of coefficient of linear expansion between the heat diffusion member 11 and the electric insulating layer 14 can be reduced. That is, a thermal stress at the bonding interface between the heat diffusion member 11 and the electric insulating layer 14 can be reduced.

To form the bonding member 26, for example, paste containing Ag particle is deposited on a surface of the electric insulating layer 14, which is to be opposed to the heat diffusion member 11, and the heat diffusion member 1 is disposed on the Ag paste. Then, the electric insulating layer 14 and the heat diffusion member 11 are heated in this condition to sinter the Ag particle. In this way, the bonding member 26 is formed.

Accordingly, in the heat source module 10 having the heat diffusion member 11 made of the carbon-base material, the thermal stress at the bonding interface between the heat diffusion member 11 and the adjacent member such as the metal member 13 and the electric insulating layer 14 can be reduced.

Also in the present embodiment, the metal particle for forming the bonding members 21, 26 have the nanosized average particle diameter. Therefore, the thermal stress can be effectively reduced.

The bonding member 26 is provided by a sintered body of a single metal, similar to the bonding members 20, 21. In such a case, the thermal conductivity of the bonding member 26 improves, as compared with a bonding member employing a multicomposite alloy. Therefore, the heat-transfer resistance is reduced in the heat transferring path between the heat diffusion member 16 and the electric insulating layer 14 through the bonding member 26. Further, the heat of the heat source 12 can be efficiently transferred to the cooler 15. In a case where the bonding member 26 is made of Ag, the heat-transfer resistance in the heat transferring path is further reduced.

In the present embodiment, the heat source (semiconductor element) 12 and the metal member 13 are bonded to each other. Since the heat diffusion member 11 is not disposed between the heat source 12 and the metal member 13, the heat-transfer resistance between the heat source 12 and the metal member 13 is reduced by the amount corresponding to the heat diffusion member 11. Accordingly, the metal member 13 can be used as an electric power leading member of the heat source 12.

The electric insulating layer 14 may have a metal thin film as a surface layer on its surface so as to improve the bonding strength with the bonding member 26, similar to the surface layer 33 of the heat diffusion member 11 of the first embodiment. The electric insulating layer 14 may further have a metal thin film as a base layer that has a favorable bonding property with both of the surface layer and the surface of the electric insulating layer 14, under the surface layer.

Figure 11:
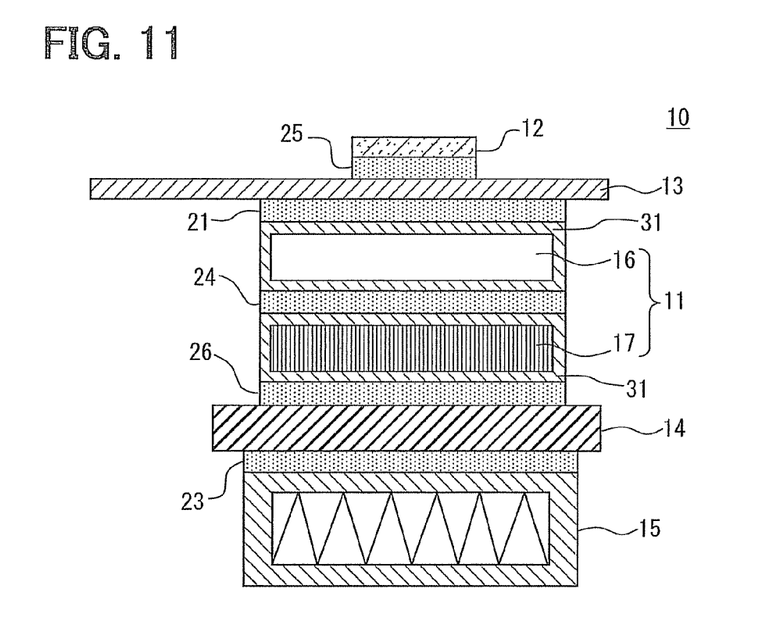
FIG. 11 is a cross-sectional view of a cooling unit as a first modification of the third embodiment.

FIG. 11 is a cross-sectional view of the heat source module 10 as a modification of the second embodiment. The heat source module 10 shown in FIG. 11 is provided by a combination of the structure shown in FIG. 10 and the structure of the second embodiment. That is, the heat diffusion member 11 including the multiple heat diffusion members, such as the first and second heat diffusion members 16, 17, can be disposed between the metal member 13 and the electric insulating layer 14.

In the above examples, the heat diffusion member 11 having the electric conductivity and the anisotropy of the thermal conductivity is disposed between the metal member 13 as the outer terminal and the electric insulating layer 14, that is, between the metal member 13 and the cooler 15. Alternatively, as described as the modification of the first embodiment, the heat diffusion member 11 having the electric conductivity and the isotropy of the thermal conductivity can be disposed between the metal member 13 and the electric insulating layer 14.

When the heat diffusion member 11 having the isotropy of the thermal conductivity is employed, the thermal conductivity is exerted in the three directions. Therefore, the heat source 12 can be effectively cooled even if only one heat diffusion member 11 is employed.

Figure 12:
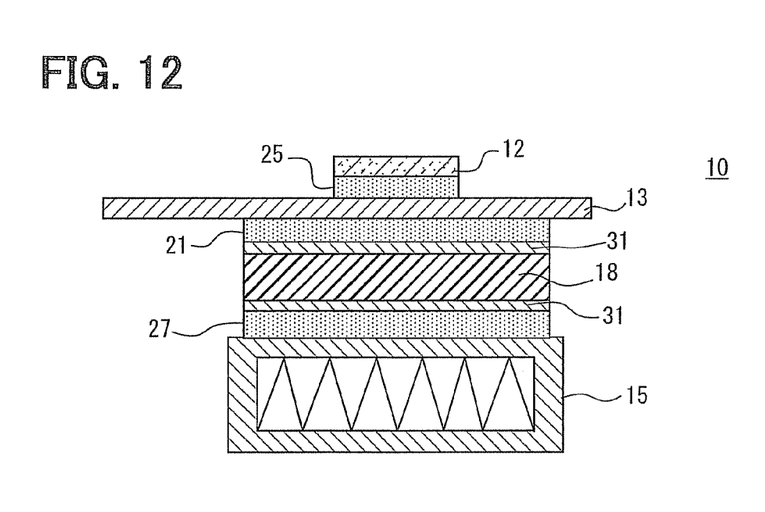
FIG. 12 is a cross-sectional view of a cooling unit as a second modification of the third embodiment.

As shown in FIG. 12, a heat diffusion member 18 having an electric insulating property can be employed. In such a case, since the heat diffusion member 18 has the electric insulating property, the electric insulating layer 14 can be eliminated. The heat diffusion member 18 is, for example, made of diamond, which has isotropy of the thermal conduction. For example, the heat diffusion member 18, which is made of diamond, can be formed by a vapor-phase synthetic method.

The metal thin film 31 is formed on the surfaces of the heat diffusion member 18, which are opposed to the metal member 13 and the cooler 13, respectively, so as to improve connection reliability with the bonding members 21, 27. The metal thin film 31 is not formed on side surfaces of the heat diffusion member 18 so as to ensure electric insulation between the metal member 13 and the cooler 15. The bonding member 27 is formed by sintering nanosized particle of a single metal, for example, similar to the above described bonding members 20, 21, 26.

Fourth Embodiment

A fourth embodiment will be described with reference to FIG. 13. Hereinafter, a structure different from the above described embodiments will be mainly described.

Figure 13:
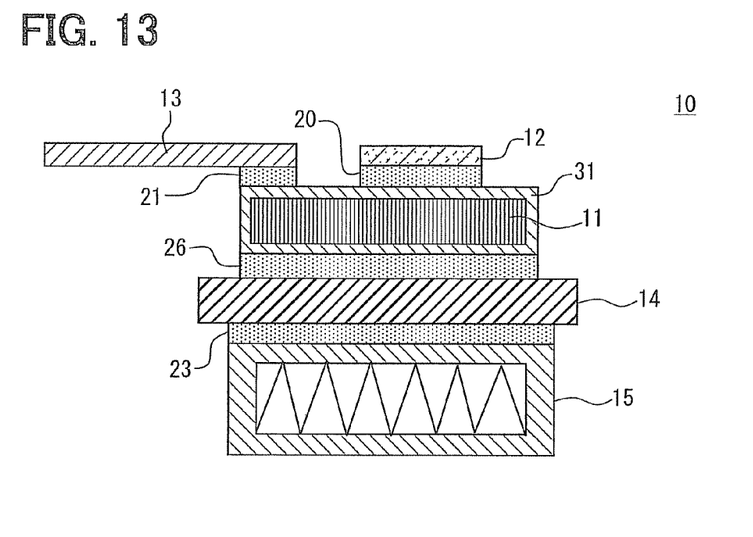
FIG. 13 is a cross-sectional view of a cooling unit of a heat source according to a fourth embodiment.

The heat source module 10 shown in FIG. 13 has a similar structure to the heat source module 10 of the third embodiment. However, the metal member 13 as the outer terminal is bonded only to the heat diffusion member 11 through the bonding member 21, and thus the heat source 12, the metal member 13 and the electric insulating layer 14 correspond to the second member.

In such a structure, the heat generated from the heat source 12 is transferred to the cooler 15 without passing through the metal member 13. Therefore, the heat-transfer resistance due to the metal member 13 is reduced. As such, the cooling efficiency improves.

The bonding member 20 disposed between the heat source 12 and the heat diffusion member 11 and the bonding member 21 disposed between the metal member 13 and the heat diffusion member 11 are the same as the bonding members 20, 21 of the first embodiment. The bonding member 26 disposed between the heat diffusion member 11 and the electric insulating layer 14 is the same as the bonding member 26 of the third embodiment.

Figure 14:
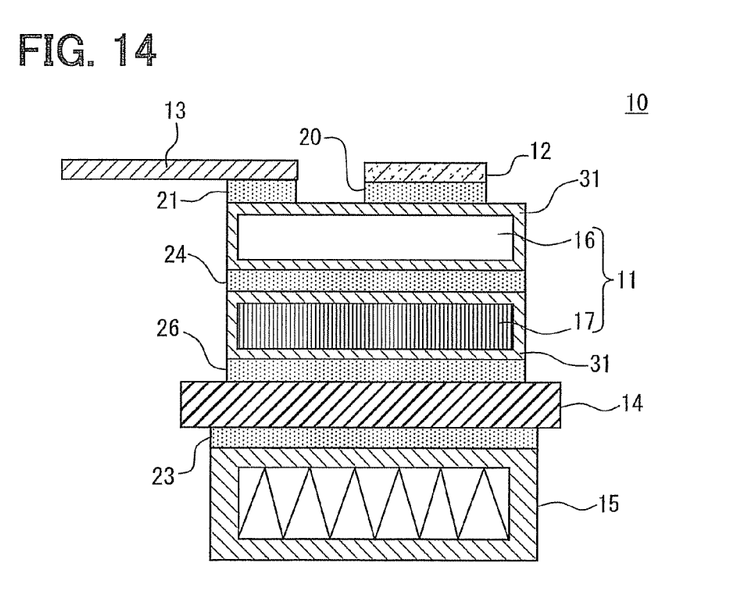
FIG. 14 is a cross-sectional view of a cooling unit as a first modification of the fourth embodiment.

The heat source module 10 of the fourth embodiment may be modified as shown in FIG. 14. That is, the heat source module 10 of the fourth embodiment may have the heat diffusion member 11 including the multiple heat diffusion members, similar to the second embodiment.

In the heat source module 10 shown in FIG. 14, the heat source 12, the metal member 13 and the electric insulating layer 14 correspond to the second member.

In the above described examples, the heat diffusion member 11 has the electric conductivity and the anisotropy of the thermal conduction. Alternatively, the heat diffusion member 11 having the electric conductivity and the isotropy of the thermal conduction may be employed in the heat source module 10.

In the case where the heat diffusion member 11 having the isotropy of the thermal conduction is employed, the thermal conductivity is exerted in three directions. Therefore, the heat source 12 can be efficiently cooled even if only one heat diffusion member 11 is employed.

Figure 15:
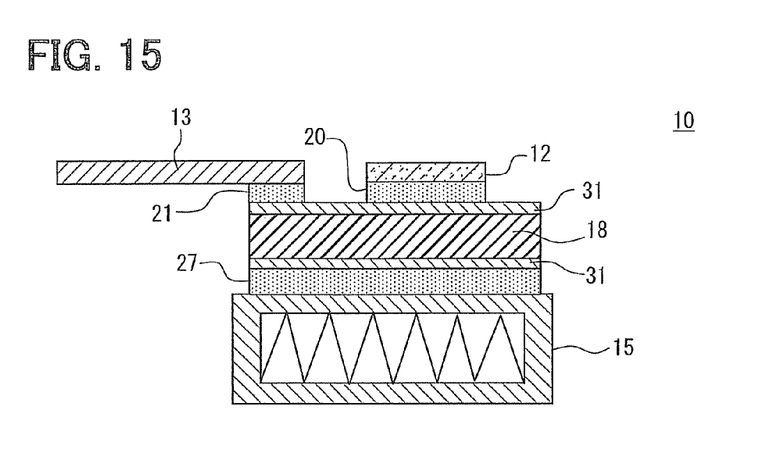
FIG. 15 is a cross-sectional view of a cooling unit as a second modification of the fourth embodiment.

Alternatively, the heat diffusion member 18 having the electric insulating property may be employed, similar to the modification of the third embodiment shown in FIG. 12. In such a case, as shown in FIG. 15, the electric insulating layer 14 can be eliminated because the heat diffusion member 18 has the electric insulating property. The heat diffusion member 18 is made of diamond having isotropy of the thermal conduction, for example. The heat diffusion member 18, which is provided by the diamond, can be formed by a vapor-phase synthetic method.

The metal thin films 31 are formed on the surfaces of the heat diffusion member 18, which are opposed to the heat source 12 and metal member 13 and the cooler 15, respectively, so as to improve reliability of connection with the bonding members 21, 27. However, the metal thin film 31 is not formed on the side surfaces of the heat diffusion member 18 so as to ensure the electric insulating property between the heat source 12 and metal member 13 and the cooler 15. The bonding member 27 is made by sintering a metal particle, such as a nanosized particle of a single metal.

Fifth Embodiment

A fifth embodiment will be described with reference to FIG. 16. Hereinafter, a structure different from the above described embodiments will be mainly described.

Figure 16:
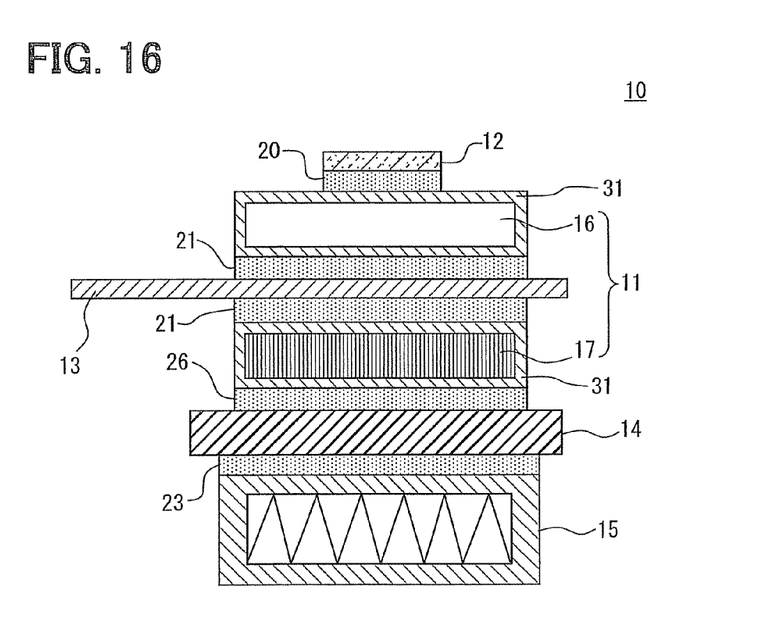
FIG. 16 is a cross-sectional view of a cooling unit of a heat source according to a fifth embodiment.

The heat source module 10 shown in FIG. 16 has a similar structure to the heat source module 10 of the second embodiment. The difference from the heat source module 10 of the second embodiment is that the metal member 13 as the outer terminal is bonded between the first heat diffusion member 16 and the second heat diffusion member 17. Thus, the heat source 12, the metal member 13 and the electric insulating layer 14 corresponds to the second member. In other words, the first heat diffusion member 16 is disposed between the heat source 12 and the metal member 13, and the second heat diffusion member 17 is disposed between the metal member 13 and the electric insulating layer 14.

In such a case, since the second heat diffusion member 17 is not disposed between the heat source 12 and the metal member 13, the electric resistance is reduced by the amount corresponding to the heat diffusion member 17, and the metal member 13 can be used as the electric power leading portion of the heat source 12.

The bonding member 20 disposed between the heat source 12 and the first heat diffusion member 16 and the bonding members 21 disposed between the metal member 13 and the heat diffusion members 16, 17 are the same as the bonding members 20, 21 of the first embodiment. The bonding member 26 disposed between the second heat diffusion member 17 and the electric insulating layer 14 is the same as the bonding member 26 of the fourth embodiment.

Sixth Embodiment

A sixth embodiment will be described with reference to FIG. 17. Hereinafter, a structure different from the above described embodiments will be mainly described.

Figure 17:
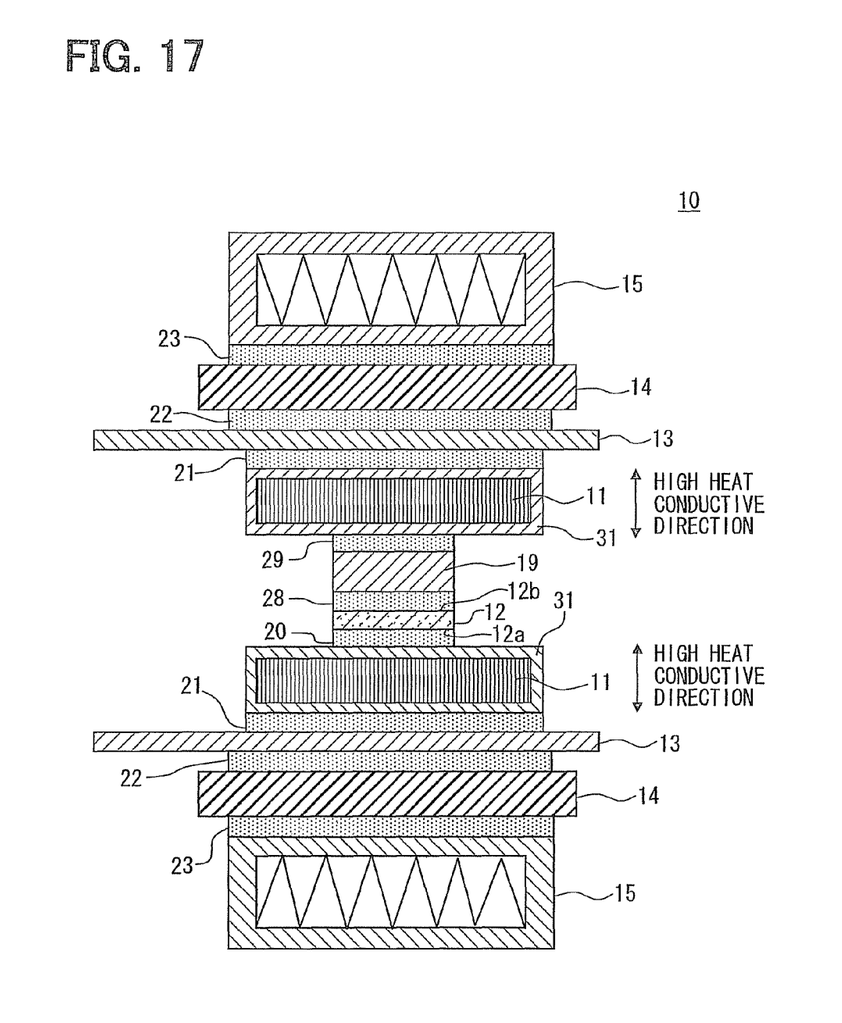
FIG. 17 is a cross-sectional view of a cooling unit of a heat source according to a sixth embodiment.

The heat source module 10 shown in FIG. 17 is provided by joining two heat source modules 10 of the first embodiment in the thickness direction, in which the heat source 12 is shared between the two heat source modules 10. In other words, the vertical element having electrodes on both sides of the semiconductor substrate is cooled on both the sides of the semiconductor substrate.

In FIG. 17, the lower heat source module illustrated under the heat source 12 has the same structure as the heat source module 10 of the first embodiment. A metal member 19 is bonded to an upper surface 12b of the heat source 12 through a bonding member 28. The metal member 19 serves as a terminal (relay member) that electrically connects the electrode disposed on the upper surface 12b of the heat source (semiconductor element) 12 to the upper metal member (lead) 13 disposed above the upper surface 12b, and thermally connects the heat source 12 and the upper cooler 15 disposed above the upper surface 12b. The metal member 19 is a metal block made of Cu, for example.

The heat diffusion member 11 having the metal thin film 31 is bonded to the surface of the metal member 19 opposite to the heat source 12 through a bonding member 29. The components located above the upper heat diffusion member 11 have the same structure to the components of the heat source module 10 of the first embodiment located below the lower heat diffusion member 11.

The bonding member 28 is made of a material that has favorable thermal conductivity and electric conductivity and can bond the heat source 12 and the metal member 19 to each other. For example, the bonding member 28 is made of a solder. Alternatively, the bonding member 28 may be provided by a sintered body of a metal particle. In such a case, the thermal stress at the bonding interface is reduced, and the thermal conductivity is improved.

The bonding member 29 that contacts the heat diffusion member 11 is provided by a sintered body of a metal particle, similar to the bonding members 20, 21. Therefore, the bonding member 29 is formed by sintering the metal particle at the low temperature, e.g., equal to or lower than 300 degrees Celsius. That is, the heat diffusion member 11 and the metal member 19 are bonded to each other at the low temperature. Therefore, the thermal stress caused by a difference of coefficient of linear expansion between the metal member 19 and the heat diffusion member 11 can be reduced. That is, the thermal stress at the bonding interface can be reduced.

For example, paste containing Ag particle is deposited on the surface of one of the heat diffusion member 11 and the metal member 19, and the heat diffusion member 11 and the metal member 19 are laid on top of the other through the Ag paste. Then, the heat diffusion member 11 and the metal member 19 are heated in this arrangement condition to sinter the Ag particle. In this way, the bonding member 29 is formed.

Accordingly, in the present embodiment, the thermal stress at the bonding interface of the bonding part between the heat diffusion member 11 and the heat source 12 through the bonding member 28 can be reduced. Also, the thermal stress at the bonding surface of the bonding part between the heat diffusion member 11 and the metal member 19 through the bonding member 29 can be reduced.

Also in the present embodiment, the bonding members 20, 21, 29 are formed using the metal particle having the nano-sized average particle diameter, respectively. Therefore, the thermal stress is effectively reduced.

In the present embodiment, for example, the bonding member 29 is provided by the sintered body of the single metal, similar to the bonding members 20, 21. In such a case, the thermal conductivity of the bonding member 29 improves, as compared with the bonding member provided by a multi-composite alloy. Therefore, the heat-transfer resistance is reduced in the heat transferring path from the heat source 12 to the upper cooler 15 through the bonding member 29 and the heat diffusion member 11. That is, the heat of the heat source 12 is effectively transferred to the cooler 15. In the case where the bonding member 29 is made of Ag, the heat-transfer resistance in the heat transferring path is further reduced.

Also in the present embodiment, the total thickness t1 of the metal thin film 31 of each heat diffusion member 11 is approximately in a range between 0.2 micrometers and 5 micrometers, and is sufficiently smaller than the thickness (e.g., approximately 20 micrometers to 40 micrometers) of the bonding members 20, 21, 29. Therefore, the heat-transfer resistance of the metal thin film 31 is almost disregarded in the heat transferring path between the lower heat diffusion member 11 and the heat source 12, the heat transferring path between each heat diffusion member 11 and the corresponding metal member 13, and the heat transferring path between the metal member 19 and the heat diffusion member 11. Accordingly, the heat-transfer resistance reduction effect achieved by the bonding members 20, 21, 29 is notable in the heat transferring paths.

The metal members 13 as the leads are disposed on opposite sides of the heat source 12. Therefore, the metal members 13 can be used as the electric power leading portions of the heat source 12.

The heat diffusion members 11 and the coolers 15 are disposed on opposite sides of the heat source 12. Therefore, the heat source 12 is further efficiently cooled.

In the present embodiment, the heat source module 10 has the both-side heat radiation structure having the heat source modules 10 of the first embodiment on the opposite sides of the heat source 12. Alternatively, the heat source module 10 having the both-side heat radiation structure may be provided by employing the heat radiation modules 10 of any of the above described embodiments in various combinations.

Additional advantages and modifications will readily occur to those skilled in the art. The invention in its broader term is therefore not limited to the specific details, representative apparatus, and illustrative examples shown and described.

What is claimed is:

1. A cooling unit comprising:
a first member having a plate shape and being made of a carbon-base material, the first member serving as a heat diffusion member that transfers heat at least in a thickness direction, which is perpendicular to a plane of the plate shape;
a heat source disposed at a first side of the first member;
a second member disposed at least at one of the first side and a second side of the first member;
a cooler disposed at the second side of the first member for cooling the heat source; and
a bonding member bonding the first member and the second member to each other, wherein:
the first member has a metal thin film at least on an opposed surface that is opposed to the second member,
the bonding member is disposed between the opposed surface of the first member and the second member,
the bonding member is provided by a sintered body of metal particle,
the heat diffusion member provided by the first member is a first heat diffusion member;
the second member has a plate shape and is made of a carbon-base material, and
the second member has a metal thin film at least on an opposed surface opposed to the first heat diffusion member and serves as a second heat diffusion member to transfer heat in the thickness direction.

2. The cooling unit according to claim 1, wherein:
each of the first member and the second member is provided by a stack of carbon-base plates, each carbon-base plate having a higher coefficient of thermal conductivity in a direction parallel to a plane of the carbon-base plate than in a direction perpendicular to the plane of the carbon-base plate; and
the first member and the second member are disposed on top of the other such that the coefficient of thermal conductivity in a direction perpendicular to the opposed surfaces is higher than a coefficient of thermal conductivity in a direction parallel to the opposed surfaces, and a stacking direction of the carbon-base plates of the first member is different from a stacking direction of the carbon-base plates of the second member.

3. The cooling unit according to claim 1, wherein the metal thin film includes at least a base layer and a surface layer, the base layer forming chemical bonding with the second member, and the surface layer being disposed on the base layer and forming metal bonding with the bonding member.

4. The cooling unit according to claim 3, wherein the base layer contains at least one of Ti, Al, Cr, Mo, and W.

5. The cooling unit according to claim 3, wherein the surface layer is made of at least one of Au, Ag, Pt, Pd, Ni, Sn, Fe, Cu, and Pb.

6. The cooling unit according to claim 3, wherein:
the metal thin film further includes a middle layer between the base layer and the surface layer; and
the middle layer is made of at least one of Au, Ag, Pt, Pd, Ni, Sn, Fe, Cu and Pb, which is different from the one of the surface layer, and forms alloy layers at interfaces with the base layer and the surface layer.

* * * * *